United States Patent
Lindenkreuz et al.

(10) Patent No.: US 9,052,510 B2
(45) Date of Patent: Jun. 9, 2015

(54) MICROMECHANICAL COMPONENT AND MANUFACTURING METHOD FOR A MICROMECHANICAL COMPONENT

(75) Inventors: Steffi Lindenkreuz, Reutlingen (DE); Gerhard Kiesewetter, Reutlingen (DE); Stefan Pinter, Reutlingen (DE); Joerg Muchow, Reutlingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 160 days.

(21) Appl. No.: 13/134,021

(22) Filed: May 25, 2011

(65) Prior Publication Data
US 2011/0292529 A1  Dec. 1, 2011

(30) Foreign Application Priority Data
Jun. 1, 2010  (DE) .......................... 10 2010 029 539

(51) Int. Cl.
*G02B 7/182* (2006.01)
*G02B 26/08* (2006.01)
*G02B 26/10* (2006.01)
*G02B 26/12* (2006.01)
*B81B 3/00* (2006.01)

(52) U.S. Cl.
CPC ....... *G02B 26/0841* (2013.01); *Y10T 29/49826* (2015.01); *B81B 3/0086* (2013.01); *B81B 2201/042* (2013.01); *B81B 2203/0109* (2013.01); *B81B 2207/07* (2013.01)

(58) Field of Classification Search
None
See application file for complete search history.

(56) References Cited

U.S. PATENT DOCUMENTS

| 7,123,400 | B2* | 10/2006 | Murakami et al. | 359/298 |
| 7,432,629 | B2* | 10/2008 | Mala et al. | 310/309 |
| 2006/0082250 | A1* | 4/2006 | Ko et al. | 310/309 |
| 2009/0244677 | A1* | 10/2009 | Mizukami et al. | 359/225.1 |

FOREIGN PATENT DOCUMENTS

DE  197 28 598  2/1999

* cited by examiner

Primary Examiner — Jade R Chwasz
(74) Attorney, Agent, or Firm — Kenyon & Kenyon LLP

(57) ABSTRACT

A micromechanical component has a holding device and an adjustable component, which is adjustable with respect to the holding device at least from a first position into a second position, and which is connected via at least one spring to the holding device. The micromechanical component also includes at least one silicide-containing line segment situated on the at least one spring.

12 Claims, 4 Drawing Sheets

MICROMECHANICAL COMPONENT AND MANUFACTURING METHOD FOR A MICROMECHANICAL COMPONENT

BACKGROUND OF THE INVENTION

1. Field of the Invention

The present invention relates to a micromechanical component and a manufacturing method for a micromechanical component.

2. Description of Related Art

Published German patent application document DE 197 28 598 A1 describes a micromechanical mirror device. The micromechanical mirror device includes a substrate, which functions as the base body, and a mirror element, which is connected to the substrate via at least one elongated spring element. The mirror element may be rotated about at least one axis of rotation with respect to the substrate by a drive, including at least one plate electrode situated on the at least one spring element.

BRIEF SUMMARY OF THE INVENTION

The present invention ensures an improvement in the traditional micromechanical component having an adjustable component, in particular an adjustable mirror surface. The design of the at least one silicide-containing line segment situated on the at least one spring ensures that this line segment reliably fulfills its function, although it is often exposed to a mechanical load due to its location. The silicide-containing material of the at least one line segment in particular is not ductile even with a mechanical load, so that there is neither decomposition of the material nor hysteresis on the at least one line segment. Thus A least one electrical element, which is situated on the adjustable component, is electrically connected to at least one external contact via the at least one silicide-containing line segment.

The at least one silicide-containing line segment usually has a good conductivity (i.e., a low resistance), an advantageous thermal stability and/or an advantageous chemical stability. This reduces the power consumption of an electrical component, which is supplied with power via the at least one line segment, while improving the measurement precision of a measurement signal relayed via the at least one line segment and/or increasing the lifetime of the micromechanical component having the at least one silicide-containing line segment.

In one advantageous refinement, the micromechanical component has at least one silicide-containing reflective coating situated on the adjustable component. The at least one silicide-containing reflective coating enables a mirror surface having a high optical reflectivity, which usually also has a good thermal stability. Because of the high reflectivity of silicides, the silicide-containing reflective coating may be formed to have a comparatively small layer thickness. This results in a reduction in the weight of the adjustable component having the reflective coating, thus ensuring greater freedom in the design of the at least one spring.

In addition, the at least one silicide-containing line segment may include at least one silicide, which is contained in the at least one silicide-containing reflective coating. In this case, the at least one line segment and the at least one reflective coating may be formed in a joint deposition operation. This reduces the manufacturing complexity of the micromechanical component and lowers the cost thereof.

The micromechanical component may have at least one silicide-containing etching mask. Because of the advantageous material properties of such a silicide-containing etching mask, it is not necessary to remove it after the etching step. The silicide-containing etching mask may instead be left on the micromechanical component even after the etching step to protect the underlying layer of material. This simplifies the manufacturing method for such a micromechanical component and additionally improves its service life.

The at least one silicide-containing line segment, which includes at least one silicide-containing reflective coating and/or the at least one silicide-containing etching mask, may preferably contain at least one of the following silicides: NiSi, $Na_2Si$, $Mg_2Si$, PtSi, $WSi_2$ and/or $TiSi_2$. The silicides mentioned here have a relatively high conductivity, a good thermal and chemical stability, a high reactivity and/or a good resistance to a steady mechanical load (low ductility). They are thus cost-effective exemplary embodiments to ensure the aforementioned advantages.

In an advantageous specific embodiment, the micromechanical component may include an electrostatic actuator having at least one stator electrode situated on the holding device and at least one actuator electrode situated on the adjustable component, so that the at least one actuator electrode is connected to a voltage source via the at least one silicide-containing line segment running over the spring from the holding device to the at least one actuator electrode. A contact resistance of an electrical connection of the at least one actuator electrode having the voltage source may thus be lowered. In particular an electrostatic actuator, operating at a relatively high speed and allowing rapid changes in the applied voltages, may thus also be formed.

The advantages mentioned in the paragraphs above are also ensured in a corresponding manufacturing method for a micromechanical component.

At least one silicide-containing reflective coating is preferably provided on the adjustable component. A micromechanical component manufactured in this way is significantly improved in comparison with the traditional specific embodiments.

In one advantageous refinement, the manufacturing method includes the additional steps: forming a silicide-containing etching mask which partially covers a surface, at least one partial area of the surface not covered by the etching mask being formed, and execution of an etching step, so that at least the material of the partial area not covered by the etching mask is removed. The silicide-containing etching mask is easily formable on the surface, easily structurable and has an advantageous chemical resistance to suitable etchants, for example, $CF_4$ and/or $SF_6$. In addition, the need for removing the silicide-containing material after performing the etching step is eliminated in the case of such an etching mask. Instead of that, the silicide-containing material may be left on the surface to protect the underlying surface because of its advantageous material properties.

The silicide-containing etching mask may preferably be formed from at least one silicide, from which the at least one silicide-containing line segment and/or the at least one silicide-containing reflective coating is formed. It is thus possible to form the etching mask, the at least one line segment and/or the reflective coating by a joint deposition step, in which the at least one silicide or the at least one metal of the etching mask to be silicided, the at least one line segment and/or the at least one reflective coating are applied simultaneously. The method steps for performing the manufacturing of the micromechanical component may thus be reduced.

The advantages described in the preceding paragraphs are also implemented with a corresponding micromechanical component.

DETAILED DESCRIPTION OF THE INVENTION

Figure 1A:
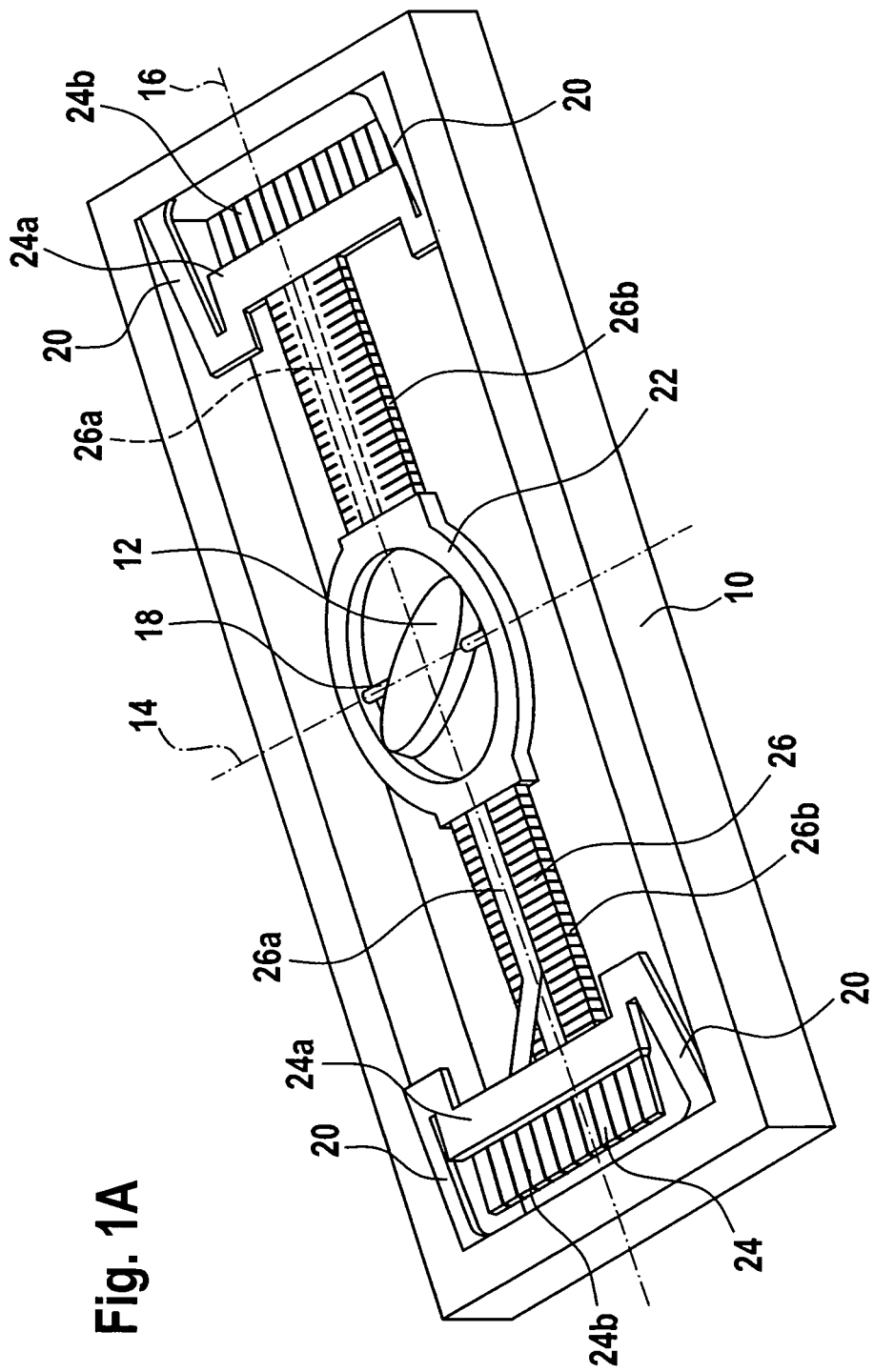
FIGS. 1A to 1C show schematic diagrams of an example embodiment of the micromechanical component.
Figure 1B:
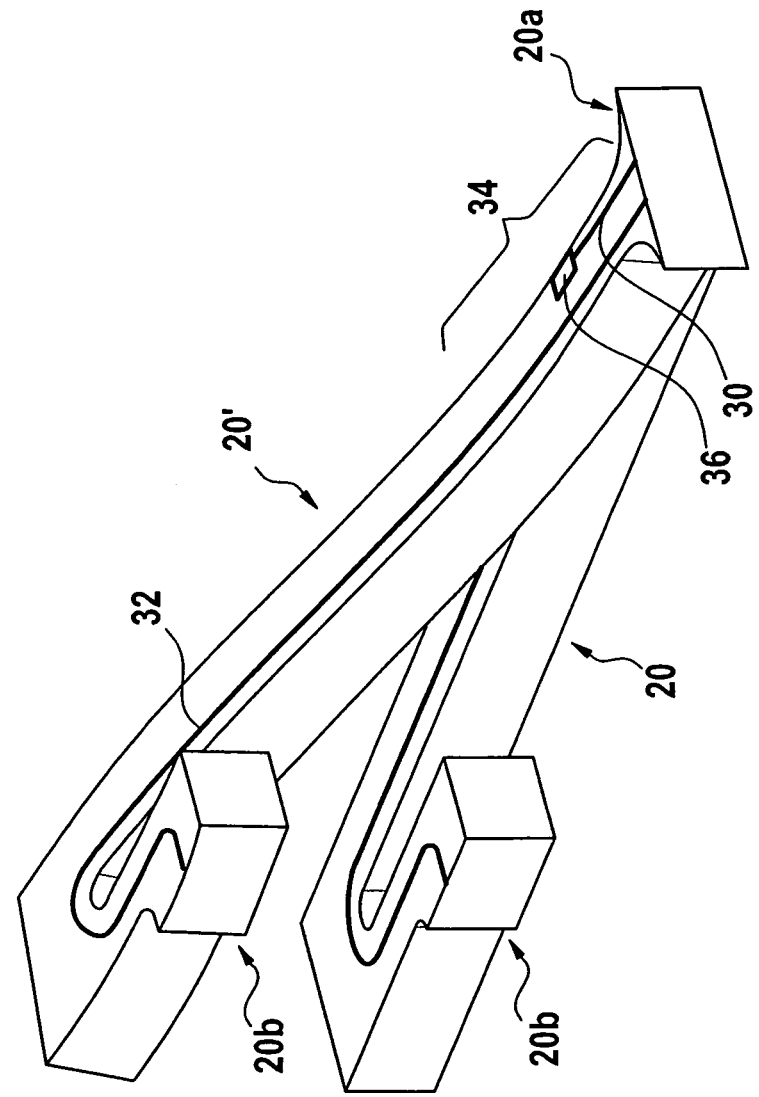
Figure 1C:
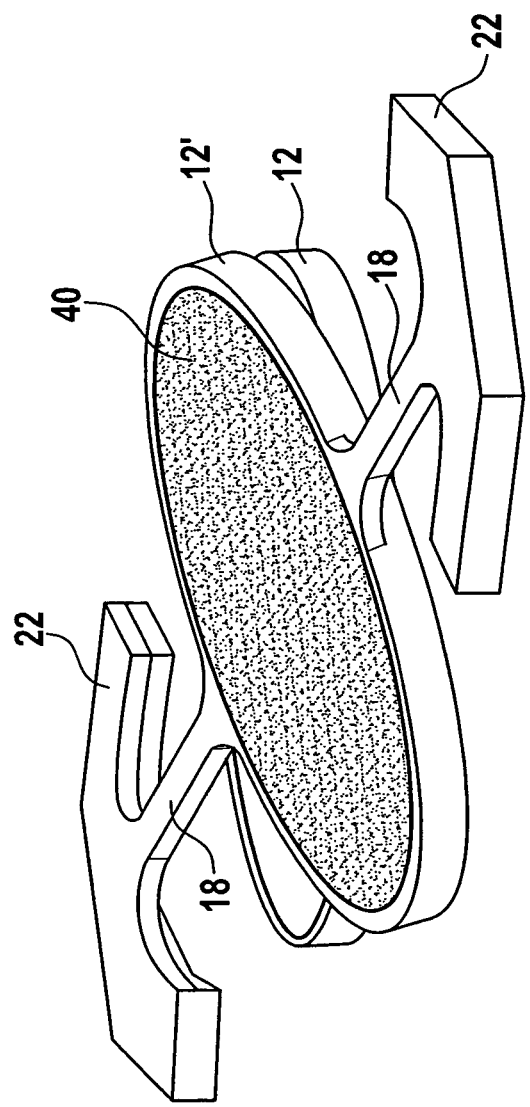

FIGS. 1A through 1C show schematic diagrams of a specific embodiment of the micromechanical component.

The micromechanical component shown schematically in FIG. 1A has a holding device 10, which is embodied as a frame, for example. Holding device 10 may be structured out of a semiconductor substrate, in particular a silicon substrate. However, the micromechanical component described here is not limited to a certain material or a certain shape of holding device 10.

The micromechanical component also has an adjustable part 12, which is adjustable from at least one first position into a second position with respect to the holding device. For example, adjustable part 12 is adjustable around at least one axis of rotation 14 and 16 with respect to holding device 10. In the specific embodiment depicted here, adjustable part 12 is rotatable with respect to holding device 10 about a first axis of rotation 14 and a second axis of rotation 16, which is not aligned parallel to the former. The second axis of rotation 16 is preferably oriented at a right angle to the first axis of rotation 14. However, it should be pointed out that the micromechanical component is not limited to the adjustability of adjustable part 12 about the two axes of rotation 14 and 16 as described here.

Adjustable part 12 is connected by at least one spring 18 and 20 to holding device 10. In the specific embodiment shown here, at least one internal spring 18, preferably running along the first axis of rotation 14, connects adjustable part 12 to a connecting part 22. For example, an internal spring 18 may extend along the first axis of rotation 14 to the connecting part 22 from each of two opposing coupling points of adjustable part 12.

In addition, connecting part 22 may be connected to holding device 10 via at least one external spring 20. In one possible implementation, the spring coupling of intermediate part 22 is designed to be mirror-symmetrical to the first axis of rotation 14. The spring coupling of intermediate part 22 may likewise be designed to be mirror-symmetrical to the second axis of rotation 16. Such a spring coupling ensures an advantageous adjustability of adjustable part 12 about both axes of rotation 14 and 16, avoiding unwanted transverse forces. The preferred spring coupling is easily implementable, for example, by connecting intermediate part 22 to holding device 10 via four external springs 20, each being situated and aligned mirror symmetrically with respect to the axes of rotation 14 and 16.

In an advantageous specific embodiment, the micromechanical component has an actuator with the aid of which adjustable part 12 is adjustable at least from the first position into the second position with respect to holding device 10. For example, the micromechanical component may include an electrostatic actuator having at least one stator electrode (not shown) situated on the holding device and at least one actuator electrode 24 and 26 situated directly on an adjustable component of the micromechanical component and/or on adjustable part 12. The distance between actuator electrode 24 or 26 and the stator electrode may be reduced by a voltage not equal to zero applied between the at least one actuator electrode 24 and 26 and the neighboring/associated stator electrode. Since the micromechanical component described here is not limited to a certain design of a voltage control device for applying a voltage not equal to zero between at least one actuator electrode 24 and 26 and the neighboring/associated stator electrode, it will not be discussed further here.

The micromechanical component described here is also not limited to one being equipped with an electrostatic actuator. In particular the micromechanical component may also be equipped with a magnetic actuator.

Adjustability of adjustable part 12 about both axes of rotation 14 and 16 is ensured, for example, if the micromechanical component has at least one first actuator electrode 24 for adjusting adjustable part 12 about the first axis of rotation 14 and at least one second actuator electrode 26 for adjusting adjustable part 12 about the second axis of rotation 16. The micromechanical component advantageously has at least two first actuator electrodes 24 for adjusting adjustable part 12 about the first axis of rotation 14 and/or at least two second actuator electrodes 26 for adjusting adjustable part 12 about the second axis of rotation 16, so that each actuator electrode 24 and 26 is assigned to one stator electrode, and a different voltage value may be applied between at least three/four actuator electrodes 24 and 26 and the associated stator electrodes. This ensures adjustability of adjustable part 12 in two opposite directions of rotation about the first axis of rotation 14 and/or about the second axis of rotation 16.

Actuator electrodes 24 and 26 are preferably situated and designed to be mirror-symmetrical to the two axes of rotation 14 and 16. Such an electrostatic drive allows an advantageous adjustment of adjustable part 12.

In the specific embodiment described here, actuator electrodes 24 and 26 are designed as electrode combs. One first actuator electrode 24 is connected to the holding device on each end of the first axis of rotation 14 via two external springs 20. Each of the two first actuator electrodes 24 includes a first connecting web 24a, contacting external springs 20, so that one of two contacting external springs 20 is situated on one end each of the second axis of rotation 16. Any number of first electrode fingers 24b may be situated on first connecting web 24a. First electrode fingers 24b are preferably oriented perpendicularly to the particular connecting web 24a.

A second connecting web 26a runs from each of first connecting webs 24a preferably along second axis of rotation 16 to intermediate part 22. Any number of second electrode fingers 26b may be situated on second connecting web 26a. Second electrode fingers 26b on both ends of the second axis of rotation 16 preferably extend away from second connecting web 26a. A first voltage may preferably be applied between second electrode fingers 26b situated on a first side of the second axis of rotation 16 and neighboring stator electrode fingers, and a second voltage not equal to the first voltage is applied between second electrode fingers 26b, situated on a second side of the second axis of rotation 16, and neighboring stator electrode fingers. In this case, second connecting web 26a together with second electrode fingers 26b situated on the first side of the second axis of rotation 16 forms a second actuator electrode 26 for a first direction of rotation about the second axis of rotation 16, and together with second electrode fingers 26b situated on the second end of the second axis of rotation 16, forms a second actuator electrode 26 for a second direction of rotation about the second axis of rotation 16.

However, it is pointed out that the micromechanical component described here is not limited to a certain number and/or design of actuator electrodes 24 and 26 and the cooperating stator electrodes (not shown). For example, at least one of the actuator electrodes and the stator electrodes cooperating therewith may be designed as plate electrodes.

In an advantageous specific embodiment, the voltage control device for applying a voltage between actuator electrodes 24 and 26 and the stator electrodes, is designed for varying the first voltage signals applied between first actuator electrodes 24 at a first frequency, which is much greater than a second frequency of the second voltage signals applied between second actuator electrodes 26. The first frequency preferably corresponds to a natural frequency of adjustable part 12 in a rotational movement about first axis of rotation 14, bending at least one internal spring 18. In this case, one may speak of resonant adjustment of adjustable part 12 about first axis of rotation 14 and a quasistatic adjustment of adjustable part 12 about second axis of rotation 16. Great deflections are achievable in this way, in particular when adjusting adjustable part 12 about first axis of rotation 14.

FIG. 1B shows an enlarged partial detail of FIG. 1A having an external spring 20.

External spring 20, shown schematically in FIG. 1B, is connected to holding device 10 (not shown) at a first anchoring region 20a and to a first actuator electrode 24 (not diagramed) at a second anchoring region 20b. External spring 20 is brought from a starting position into a bent position 20' at least in an adjustment of adjustable part 12 about first axis of rotation 14. At least partial areas of external spring 20 are then brought into a modified form in particular when mechanical stresses occur.

At least one silicide-containing line segment 30 and 32 is situated on external spring 20. Placing the at least one silicide-containing line segment 30 and 32 on external spring 20 may be understood to mean that, for example, the at least one silicide-containing line segment 30 and 32 contacts a spring segment of external spring 20, which undergoes a change in shape when the adjustable part is adjusted about the first axis of rotation 14. Likewise this may also be understood to mean that at least one silicide-containing line segment 30 and 32 contacts at least one partial segment of external spring 20, which is situated between anchoring regions 20a and 20b, i.e., is suspended over anchoring regions 20a and 20b and/or is contacted thereover with holding device 10 and first actuator electrode 24.

The at least one silicide-containing line segment 30 and 32 situated on the at least one spring (18 and) 20 may be used in particular for contacting drive units such as, for example, capacitive electrode combs, a piezoelectric ceramic and/or at least one coil for generating a magnetic field. Furthermore, sensor elements, for example, a capacitive comb and/or a piezoelectric resistor may be triggered and/or evaluated via a silicide-containing line segment 30 and 32 running via at least one spring (18 and) 20.

For example, external spring 20 may have a first silicide-containing line segment 30 leading from the holding device to a spring region 34 suspended over anchoring regions 20a and 20b. First silicide-containing line segment 30 may connect at least one first electrical component situated in or on external spring 20 to an electrical device, for example, a power source, a control device and/or an evaluation device situated fixedly with respect to holding device 10. In an advantageous specific embodiment, the first electrical component is a sensor 36, which is designed to ascertain mechanical stresses, such as those occurring in a transition of external spring 20 from the starting position into a bent position, and to supply a corresponding sensor signal over first line segment 30. In this case, spring region 34 is preferably situated in the vicinity of first anchoring region 20a or second anchoring region 20b. As a stress sensor, sensor 36 may contain at least one silicide as a piezoelectric element. This reduces the cost of implementation thereof.

As an addition or alternative to first line segment 30, a second silicide-containing line segment 32 may also run over external spring 20 from the holding device at least to second anchoring region 20b. At least one second electrical component situated in or on a spring 18, an actuator electrode 24 and 26, intermediate part 22 and/or adjustable part 12 may be connected via the second line segment 32 to an electrical device such as a power source, a control device and/or an evaluation device which is fixedly situated with respect to holding device 10. For example, a conductive surface of the at least one actuator electrode 24 and 26 may be connected to a power source via at least one silicide-containing second line segment 32 running from the holding device via external spring 20 to the at least one actuator electrode.

A plurality of line segments 30 and 32 of the type of first line segment 30 and/or of the type of second line segment 32 may also be situated on the at least one external spring 20. Silicide-containing line segments 30 and 32 may also be provided on the at least one internal spring 18. These silicide-containing line segments 30 and 32 are preferably made of low-impedance silicides, thereby additionally reducing the probability of hysteresis.

In the case of the micromechanical component shown schematically here, springs 18 and 20 are often exposed to a steady load having a plurality of vibrational cycles. Based on the silicide contained in the at least one line segment 30 or 32, the at least one line segment 30 or 32 has an advantageous resistance to this load. The at least one silicide-containing line segment 30 and 32 is not ductile because of the silicide contained therein, even with a steady mechanical load in the prevailing stress region. Thus even with frequent transitions of at least one spring 18 and 20 out of the starting position into a bent position, there is neither destruction of material nor hysteresis on line segment 30 or 32. Reliable functioning of line segment 30 or 32, which runs via the particular spring 18 or 20, is thus ensured in particular under a torsional load and/or bending load of a spring 18 or 20. This is still the case even after a vibration load of more than $10^{11}$ vibration cycles. The at least one silicide-containing line segment 30 and 32 thus also reliably fulfills its desired function even in the event of a rapid bending of the at least one spring 18 and 20 coupled to a resonant adjustment of adjustable part 12 about the first axis of rotation 14.

In addition, the at least one silicide-containing line segment 30 or 32 has a low specific impedance. Thus only low power losses occur on the at least one line segment 30 and 32. This ensures an advantageous contactability of and/or power supply to an electrical component situated on springs 18 and 20, actuator electrodes 24 and 26, intermediate part 22 and/or adjustable part 12 via the at least one silicide-containing line segment 30 and 32 and an electrical device such as a current source, a control device and/or an evaluation device fixedly situated with respect to holding device 10.

FIG. 1C shows an enlarged partial detail of FIG. 1A together with adjustable part 12.

In addition to at least one silicide-containing line segment 30 and 32, at least one silicide-containing reflective coating 40 may be applied to adjustable part 12, on the at least one spring 18, at least one actuator electrode 24 and 26 and/or on intermediate part 22. However, the micromechanical component described here is not limited to such a silicide-containing reflective coating 40. Adjustable part 12 may be embodied as an adjustable mirror panel, for example, which is adjustable at least from a starting position into a position 12' inclined with respect to the former via silicide-containing reflective coating 40. However, the micromechanical component described here is not limited to a design of adjustable part 12 as a mirror panel.

Since silicides have a high optical reflectivity, they are suitable to form a mirror metallization having a comparatively thin layer thickness in particular. The total weight suspended via at least one spring 18 and 20 may be reduced in this way. This allows greater freedom in designing the at least one spring 18 and 20.

In addition to the at least one silicide-containing line segment 30 and 32 and/or the at least one reflective coating 40, the micromechanical component may additionally have at least one silicide-containing etching mask, such as that used in structuring the front and/or rear sides in particular. This is discernible, for example, by the fact that the micromechanical component has at least one silicide-covered surface on the front and/or rear sides. Because of the advantageous properties of the at least one silicide of the etching mask, for example, freedom from hysteresis, it is not necessary to remove the etching mask after the particular etching step. The etching mask may instead be left on the micromechanical component to additionally protect the material underneath in this way. This simplifies the manufacturing procedure and reduces the cost of the micromechanical component.

The at least one silicide-containing etching mask may be formed in particular from at least one silicide, from which the at least one silicide-containing line segment 30 and 32 and/or the at least one silicide-containing reflective coating 40 is formed. This allows simultaneous application of the at least one silicide or the at least one metal to form the at least one silicide in forming the etching mask, the at least one line segment 30 and 32 and/or the at least one reflective coating 40. The working steps and the manufacturing cost of the micromechanical component may be reduced in this way.

The at least one silicide-containing line segment 30 and 32, the at least one silicide-containing reflective coating 40 and/or the at least one silicide-containing etching mask preferably contain(s) at least one of the following silicides: NiSi, $Na_2Si$, $Mg_2Si$, PtSi, $WSi_2$ and/or $TiSi_2$. Reflective coating 40 in particular may be formed completely from at least one of these silicides. Likewise the at least one line segment 30 and 32, apart from insulation at least partially surrounding the at least one line segment 30 and 32, may be formed from this at least one silicide. The silicides listed here have good mechanical properties, a good thermal stability, good conductivity, advantageous chemical resistance and/or a high optical reflectivity. These silicides are thus advantageously suitable for use for line segments 30 and 32, for reflective coating 40 and/or the etching mask (not shown).

An advantageous specific embodiment of the micromechanical component has the at least one silicide-containing line segment 30 and 32 and the at least one silicide-containing reflective coating 40. An advantageous electrical connection of at least one electrical component situated on a spring 18 or 20, on an actuator electrode 24 or 26, on intermediate part 22 and/or on adjustable part 12 is thus implementable on an electrical device fixedly connected to holding device 10 simultaneously with a comparatively thin layer thickness of reflective coating 40.

In this case the at least one silicide-containing line segment 30 and 32 may include at least one silicide, in particular at least one of the silicides listed above, contained in the at least one silicide-containing reflective coating 40. The at least one silicide or the at least one metal to form the at least one silicide for the at least one line segment 30 and 32 and at the least one reflective coating 40 may thus be applied in one method step.

Figure 2:
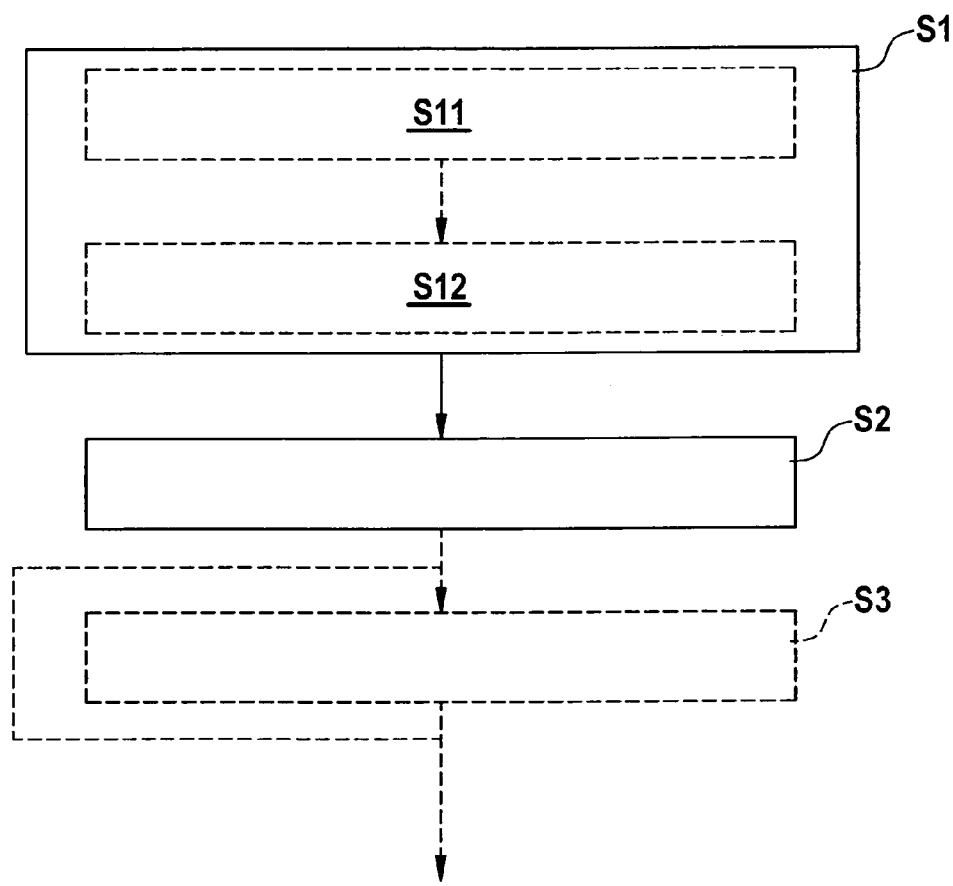
FIG. 2 shows a flow chart to illustrate an example embodiment of the manufacturing method.

FIG. 2 shows a flow chart to illustrate a specific embodiment of the manufacturing method.

For example, the micromechanical component described above may be implemented with the aid of the manufacturing method described below. However, it is pointed out that the applicability of the manufacturing method is not limited to this micromechanical component.

In a method step S1, an adjustable part of the micromechanical component is connected to a holding device on the micromechanical component via at least one spring, so that during the operation of the micromechanical component the adjustable part is adjusted with respect to the holding device, at least from a first position into a second position. Likewise a drive for adjusting the adjustable part with respect to the holding device at least from a first position into a second position may be formed. Suitable actuators with which the mechanical component may be equipped in method step S1, for example, are already mentioned above.

The connection of the adjustable part to the holding device by the at least one spring may be accomplished, for example, by forming a layer structure including at least one substrate, a sacrificial layer, which covers, at least partially, a top side of the substrate, and a semiconductor layer of polysilicon, for example, which covers, at least partially, the sacrificial layer. Next the holding device may be structured out of the substrate. Likewise at least partial areas of the at least one spring and of the adjustable part may be structured out of the semiconductor layer. With respect to a suitable design of the at least one spring, reference is made to the descriptions above. In addition to the adjustable part and the at least one spring, at least one partial area of at least one drive component, for example, a plate electrode and/or a comb electrode may be structured out of the semiconductor layer.

Method step S1 may optionally also include method steps S11 and S12. In optional method step S11, a silicide-containing etching mask partially covering a surface is formed. At least one partial area not covered by the etching mask is embodied to form the surface. For example, at least one silicide-containing etching mask is applied to an outside of the semiconductor layer and/or to an underside of the substrate.

An insulating layer is optionally formed on the surface. Next a thin metal layer of a metal, for example, nickel, sodium, magnesium, platinum, tungsten and/or titanium may be formed on the insulation layer. A mask material, preferably silicon dioxide, is then deposited on areas of the thin metal layer. A polysilicon layer is applied to certain regions whose layer thickness is predefined so that regions of the thin metal layer underneath are silicided during a subsequent temperature step. However, only the metal in the regions which are not covered by the mask material are silicided. The polysilicon not converted to a silicide is removed by wet polysilicon etching. The mask material is also removed in a wet etching step, which is preferably selective for silicon dioxide. A wet etching step, which is selective for silicides over silicon dioxide, may optionally be used to prevent underetching. The etching mask formed in this way is resistant to erosion in a plasma etching environment which contains halogen.

If method step S11 is performed, an etching step may be performed in a subsequent method step S12, so that at least the material of the partial area not covered by the etching mask is removed. Suitable etching materials include, for example, fluorides, in particular $CF_4$ and $SF_6$.

In a method step S2, at least one silicide-containing line segment is situated on the at least one spring. Suitable exemplary embodiments for the at least one silicide-containing line segment have already been mentioned above.

In addition to method step S2, the manufacturing method may also include a method step S3, in which at least one silicide-containing reflective coating is applied to the adjustable part. However, the manufacturing method described here is not limited to performing method step S3.

If method steps S11 and S12 are performed, the silicide-containing etching mask may be formed from at least one silicide, from which the at least one silicide-containing line segment and/or the at least one silicide-containing reflective coating is formed. For example, the at least one silicide or the at least one metal, which is converted to the at least one silicide, may thus be deposited to form the etching mask of the at least one line segment and/or the at least one reflective coating in a joint deposition step.

In the manufacturing method described here, for example, NiSi, Na$_2$Si, Mg$_2$Si, PtSi, WSi$_2$ and/or TiSi$_2$ may be used as the silicide. These silicides have the advantageous material properties already mentioned above. However, the manufacturing method is not limited to the use of the silicides listed here.

What is claimed is:

1. A micromechanical component, comprising:
   a holding device; and
   an adjustable component connected to the holding device via at least one spring, wherein the adjustable component is configured to be adjustable with respect to the holding device at least from a first position into a second position;
   wherein the at least one spring includes an internal spring and an external spring, wherein the internal spring extends along a first axis of rotation with respect to the holding device and connects the adjustable component to a connecting part, and the external spring extends along a second axis of rotation with respect to the holding device and connects the connecting part to the holding device,
   wherein at least one silicide-containing conductive line segment is situated on the internal spring, the silicide-containing conductive line segment being a compound of silicon and a metal.

2. The micromechanical component as recited in claim 1, wherein at least one silicide-containing reflective coating is applied to the adjustable component.

3. The micromechanical component as recited in claim 2, wherein the at least one silicide-containing conductive line segment includes at least one silicide which is also included in the at least one silicide-containing reflective coating.

4. The micromechanical component as recited in claim 2, further comprising:
   at least one silicide-containing etching mask.

5. The micromechanical component as recited in claim 2, wherein at least one of the at least one silicide-containing conductive line segment and the at least one silicide-containing reflective coating contains at least one of the following silicides: NiSi, Na$_2$Si, Mg$_2$Si, PtSi, WSi$_2$ and TiSi$_2$.

6. The micromechanical component as recited in claim 2, further comprising:
   an electrostatic actuator having at least one stator electrode situated on the holding device and at least one actuator electrode situated on the adjustable component, the at least one actuator electrode being connected to a voltage source via the at least one silicide-containing conductive line segment extending from the holding device via the at least one spring to the at least one actuator electrode.

7. The micromechanical component as recited in claim 1, wherein the holding device is embodied as a frame.

8. The micromechanical component as recited in claim 1, wherein the line segment extends a partial length across the at least one spring.

9. A manufacturing method for a micromechanical component, comprising:
   connecting an adjustable component to a holding device via at least one spring such that the adjustable component is adjustable with respect to the holding device at least from a first position into a second position, wherein the at least one spring includes an internal spring and an external spring, wherein the internal spring extends along a first axis of rotation with respect to the holding device and connects the adjustable component to a connecting part, and the external spring extends along a second axis of rotation with respect to the holding device and connects the connecting part to the holding device; and
   providing at least one silicide-containing conductive line segment on the internal spring, the silicide-containing conductive line segment being a compound of silicon and a metal.

10. The manufacturing method as recited in claim 9, further comprising:
    applying at least one silicide-containing reflective coating to the adjustable component.

11. The manufacturing method as recited in claim 10, further comprising:
    forming a silicide-containing etching mask which partially covers a surface such that at least one partial area of the surface not covered by the etching mask is formed; and
    performing an etching step so that at least the material of the partial area not covered by the etching mask is removed.

12. The manufacturing method as recited in claim 11, wherein the silicide-containing etching mask contains at least one silicide which is also included in at least one of the at least one silicide-containing conductive line segment and the at least one silicide-containing reflective coating.

* * * * *